United States Patent
Takayama

(10) Patent No.: US 10,715,132 B2
(45) Date of Patent: Jul. 14, 2020

(54) GATE DRIVER CIRCUIT OF POWER TRANSISTOR, AND MOTOR DRIVER CIRCUIT

(71) Applicant: ROHM CO., LTD., Kyoto (JP)

(72) Inventor: Yohei Takayama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/266,633

(22) Filed: Feb. 4, 2019

(65) Prior Publication Data

US 2019/0245534 A1 Aug. 8, 2019

(30) Foreign Application Priority Data

Feb. 6, 2018 (JP) ................. 2018-019072

(51) Int. Cl.
| | |
|---|---|
| H02P 1/00 | (2006.01) |
| H02P 1/28 | (2006.01) |
| H02P 3/00 | (2006.01) |
| H03K 17/16 | (2006.01) |
| H02P 27/06 | (2006.01) |
| H02M 7/5387 | (2007.01) |
| H02M 1/08 | (2006.01) |
| H05B 45/37 | (2020.01) |

(52) U.S. Cl.
CPC ............ *H03K 17/162* (2013.01); *H02M 1/08* (2013.01); *H02M 7/5387* (2013.01); *H02P 27/06* (2013.01); *H03K 2217/0036* (2013.01); *H05B 45/37* (2020.01)

(58) Field of Classification Search
CPC .............. H03K 17/162; H02M 1/08
USPC ......................................................... 318/504
See application file for complete search history.

(56) References Cited

U.S. PATENT DOCUMENTS

| | | | | |
|---|---|---|---|---|
| 7,224,135 | B1* | 5/2007 | Menegoli ............... | G11B 19/28 318/294 |
| 2013/0328610 | A1* | 12/2013 | Hayashi ................. | H03K 3/013 327/310 |
| 2014/0320197 | A1* | 10/2014 | Berkhout ........... | H03K 17/0822 327/389 |

FOREIGN PATENT DOCUMENTS

JP 2014155412 A 8/2014

* cited by examiner

*Primary Examiner* — Erick D Glass
(74) *Attorney, Agent, or Firm* — Cantor Colburn LLP

(57) ABSTRACT

Gate driver circuit for driving power transistor includes: gate line to be connected to the transistor; source line to be connected to the transistor; first current source sourcing current to the gate line; and second current source sinking current from the gate line, wherein the first current source includes: first reference impedance element connected to power supply line; first reference transistor installed between the first reference impedance element and the gate line; first error amplifier having output connected to gate of the first reference transistor, one input connected to the first reference impedance element, and the other input where first reference voltage is input; and first transistor elements installed between the power supply line and the gate line, and wherein the first current source is switched between a state, in which gate of each first transistor element is connected to the output of the first error amplifier, and OFF state.

11 Claims, 8 Drawing Sheets

Comparative technique

GATE DRIVER CIRCUIT OF POWER TRANSISTOR, AND MOTOR DRIVER CIRCUIT

CROSS-REFERENCE TO RELATED APPLICATION

The present invention claims priority under 35 U.S.C. § 119 to Japanese Patent Application No. 2018-019072, filed on Feb. 6, 2018, the entire contents of which are incorporated herein by reference.

TECHNICAL FIELD

The present disclosure relates to a gate driver circuit for driving a power transistor.

BACKGROUND

In the field of power electronics such as a motor driver, a switching power supply, and the like, a gate driver circuit for driving a power transistor is a very important element technology. In the present disclosure, a combination of a power transistor such as a half-bridge circuit, an H-bridge circuit, a single-phase inverter, a three-phase inverter, a switching power supply, or the like, and a driver circuit for driving the power transistor will be generally referred to as a switching circuit.

FIG. 1 is a simplified block diagram of a switching circuit. A switching circuit 100R includes a half-bridge circuit 102 and a gate driver circuit 200, and supplies a load connected to an OUT terminal with a rectangular AC voltage $V_{OUT}$ that transitions to two voltages $V_{DD}$ and $V_{SS}$.

The half-bridge circuit 102 includes a high-side transistor 104 and a low-side transistor 106, which are power transistors.

The gate driver circuit 200 includes a high-side driver 210 and a low-side driver 220. The high-side driver 210 includes a first current source 212 for sourcing a current to a gate of the high-side transistor 104 in an enable state and a second current source 214 for sinking a current from the gate of the high-side transistor 104 in the enable state.

When a control signal $S_H$ is at an ON level (e.g., high) for instructing to turn on the high-side transistor 104, the first current source 212 is enabled and the second current source 214 is disabled. Thus, a current $I_{ON}$ is supplied from the first current source 212 to the gate of the high-side transistor 104 to raise a gate voltage $V_{GH}$, and when it exceeds a threshold value, the high-side transistor 104 is turned on.

When the control signal $S_H$ is at an OFF level (e.g., low) for instructing to turn off the high-side transistor 104, the first current source 212 is disabled and the second current source 214 is enabled. Thus, the charge on the gate of the high-side transistor 104 is discharged by a current $I_{OFF}$ generated by the second current source 214 to decrease the gate voltage $V_{GH}$, and when it falls below the threshold value, the high-side transistor 104 is turned off.

The low-side driver 220 includes a first current source 222 and a second current source 224, and is configured in a similar manner to the high-side driver 210.

When the high-side transistor 104 and the low-side transistor 106 are externally attached to the gate driver circuit 200, there may be a case where it is desired to adjust the amounts of the currents $I_{ON}$ and $I_{OFF}$ according to a required slew rate (slope) of gate capacitance and gate voltage of the high-side transistor 104 and the low-side transistor 106.

SUMMARY

The present disclosure provides some embodiments of a gate driver circuit capable of changing a slew rate.

According to an embodiment of the present disclosure, there is provided a gate driver circuit for driving a power transistor. The gate driver circuit includes: a gate line configured to be connected to a gate of the power transistor; a source line configured to be connected to a source of the power transistor; a first current source configured to source a current to the gate line; and a second current source configured to sink a current from the gate line.

The first current source includes: a first reference impedance element having one end connected to a power supply line; a first reference transistor installed between the other end of the first reference impedance element and the gate line; a first error amplifier having an output connected to a gate of the first reference transistor, one input connected to the other end of the first reference impedance element, and the other input to which a first reference voltage is input; and a plurality of first transistor elements installed in parallel between the power supply line and the gate line. The first current source is configured to be switched between a state, in which a gate of each of the plurality of first transistor elements is connected to the output of the first error amplifier, and an OFF state.

According to another embodiment of the present disclosure, there is provided a gate driver circuit for driving a power transistor. The gate driver circuit includes: a gate line configured to be connected to a gate of the power transistor; a source line configured to be connected to a source of the power transistor; a first current source configured to source a current to the gate line; and a second current source configured to sink a current from the gate line. The first current source includes: a first reference impedance element having one end connected to a power supply line; a plurality of first transistor elements installed in parallel between the other end of the first reference impedance element and the gate line; a first drive transistor installed between the power supply line and the gate line and being of the same type as the first transistor element; and a first error amplifier having an output connected to the gate of the first drive transistor, one input connected to the other end of the first reference impedance element, and the other input to which a first reference voltage is input. The first current source is configured to be switched between a state, in which a gate of at least one of the plurality of first transistor elements is connected to the output of the first error amplifier, and an OFF state.

In some embodiments, the second current source includes: a second reference impedance element having one end connected to the source line; a plurality of second transistor elements installed in parallel between the other end of the second reference impedance element and the gate line; a second drive transistor installed between the power supply line and the gate line and being of the same type as the second transistor element; and a second error amplifier having an output connected to a gate of the second drive transistor, one input connected to the other end of the second reference impedance element, and the other input to which a second reference voltage is input. The second current source is configured to be switched between a state, in which a gate of at least one of the plurality of second transistor elements is connected to the output of the second error amplifier, and an OFF state.

According to another embodiment of the present disclosure, there is provided a gate driver circuit for driving a power transistor. The gate driver circuit includes: a gate line configured to be connected to a gate of the power transistor; a source line configured to be connected to a source of the power transistor; a first current source configured to source a current to the gate line; and a second current source configured to sink a current from the gate line.

According to another embodiment of the present disclosure, there is provided a gate driver circuit for driving a power transistor. The gate driver circuit includes: a gate line configured to be connected to a gate of the power transistor; a source line configured to be connected to a source of the power transistor; a first current source configured to source a current to the gate line; and a second current source configured to sink a current from the gate line. The first current source includes: a first reference impedance element having one end connected to a power supply line; a first reference transistor installed between the other end of the first reference impedance element and the gate line; a first drive transistor installed between the power supply line and the gate line and being of the same type as the first reference transistor; and a first error amplifier having an output connected to a gate of each of the first reference transistor and the first drive transistor, one input connected to the other end of the first reference impedance element, and the other input to which a first reference voltage is input. A size of at least one of the first reference transistor and the first drive transistor is variable.

In some embodiments, the second current source includes: a second reference impedance element having one end connected to the source line; a second reference transistor installed between the other end of the second reference impedance element and the gate line; a second drive transistor installed between the source line and the gate line and being of the same type as the second reference transistor; and a second error amplifier having an output connected to a gate of each of the second reference transistor and the second drive transistor, one input connected to the other end of the second reference impedance element, and the other input to which a second reference voltage is input. A size of at least one of the second reference transistor and the second drive transistor is variable.

In the present disclosure, the term "impedance device" or "impedance element" refers to a device that generates a voltage drop according to a current flowing therethrough, and includes a resistor, an appropriately biased transistor, and the like.

Further, arbitrarily combining the foregoing components or substituting the components or expressions of the present disclosure with each other among a method, an apparatus, a system, and the like is also effective as an embodiment of the present disclosure.

DETAILED DESCRIPTION

Figure 1:
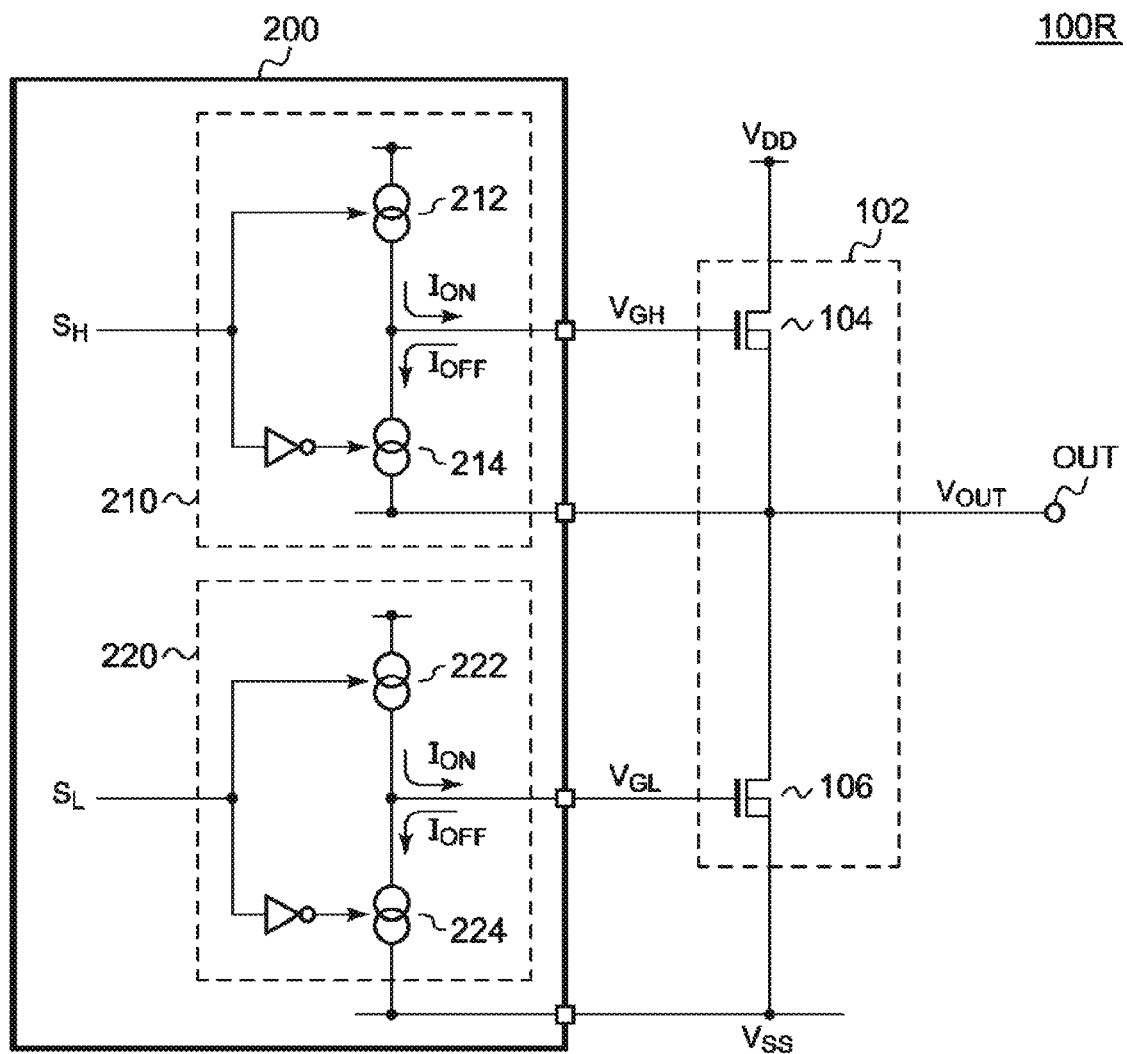
FIG. 1 is a simplified block diagram of a switching circuit.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case where the member A and the member B are indirectly connected through any other member that does not affect an electrical connection state between the members A and B or does not impair functions and effects achieved by combinations of the members A and B.

Similarly, "a state where a member C is installed between a member A and a member B" includes a case where the member A and the member C or the member B and the member C are indirectly connected through any other member that does not affect an electrical connection state between the member A and the member C or the member B and the member C or does not impair functions and effects achieved by combinations of the member A and the member C or the member B and the member C, in addition to a case where the member A and the member C or the member B and the member C are directly connected.

Similarly, "a state where a member C is installed between a member A and a member B" includes a case where the member A and the member C or the member B and the member C are indirectly connected through any other member that does not affect an electrical connection state between the member A and the member C or the member B and the member C, in addition to a case where the member A and the member C or the member B and the member C are directly connected.

Figure 2:
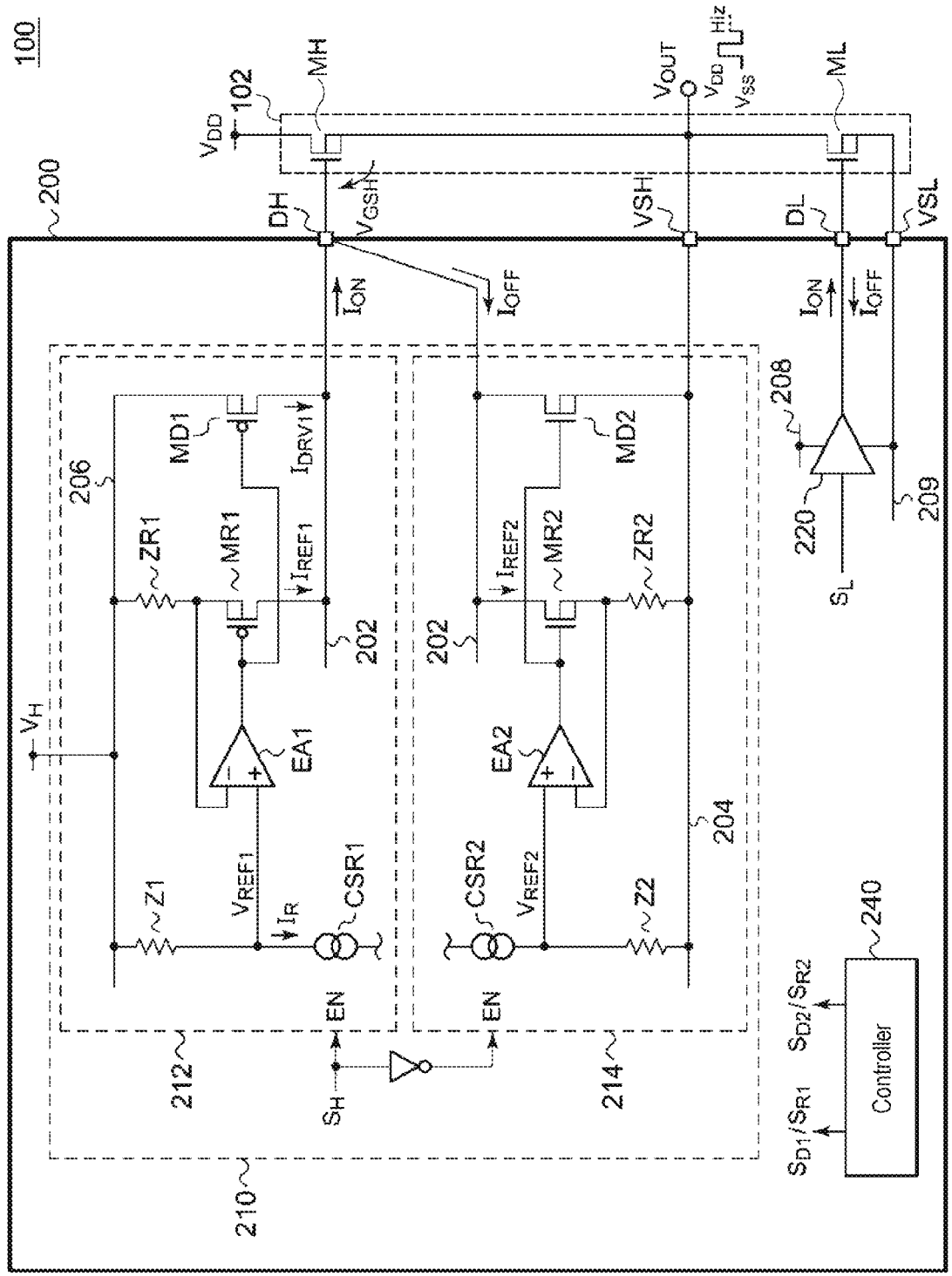
FIG. 2 is a circuit diagram of a switching circuit according to an embodiment of the present disclosure.

FIG. 2 is a circuit diagram of a switching circuit 100 according to an embodiment of the present disclosure. The switching circuit 100 generates an output voltage $V_{OUT}$ that can take either one of two voltages $V_{DD}$ and $V_{SS}$ or a high impedance state. The switching circuit 100 includes a bridge circuit 102 and a gate driver circuit 200. The gate driver circuit 200 may be an integrated circuit (IC) integrated on a semiconductor substrate.

The bridge circuit 102 includes a high-side transistor MH and a low-side transistor ML. The high-side transistor MH and the low-side transistor ML are power transistors and may be N-channel MOS transistors or N-channel insulated gate bipolar transistors (IGBTs), NPN type bipolar transistors, or super junction transistors.

The gate driver circuit 200 drives the high-side transistor MH and the low-side transistor ML depending on control signals $S_H$ and $S_L$. The gate driver circuit 200 includes a high-side driver 210 and a low-side driver 220. The high-side driver 210 turns on the high-side transistor MH when the control signal $S_H$ is at an ON level (e.g., high) and turns off the high-side transistor MH when the control signal $S_H$ is at an OFF level (e.g., low). The high-side driver 210 is installed between a power supply line 206 and a source line 204.

Similarly, the low-side driver 220 turns on the low-side transistor ML when the control signal $S_L$ is at an ON level (e.g., high) and turns off the low-side transistor ML when the control signal $S_L$ is at an OFF level (e.g., low). The low-side driver 220 is installed between a power supply line 208 and a source line 209.

The gate driver circuit 200 includes a high-side output pin DH, a low-side output pin DL, a high-side source pin VSH, and a low-side source pin VSL. The high-side output pin DH and the high-side source pin VSH are connected to a gate and a source of the high-side transistor MH, respectively. The low-side output pin DL and the low-side source pin VSL are connected to a gate and a source of the low-side transistor ML, respectively.

Since the high-side driver 210 and the low-side driver 220 are similarly configured, the high-side driver 210 will be described in detail herein.

A gate line 202 is connected to a gate of the high-side transistor MH via the high-side output pin DH. A source line 204 is connected to the source of the high-side transistor MH via the high-side source pin VSH. When the high-side transistor MH is an IBGT, the source may be read as the emitter.

The high-side driver 210 includes a first current source 212 and a second current source 214 connected to the gate line 202. The first current source 212 can be switched between an enable state and a disable state depending on the control signal $S_H$, becomes an enable state when the control signal $S_H$ is at an ON level, and sources (discharges) a current $I_{ON}$ to the gate of the high-side transistor MH via the gate line 202.

The second current source 214 can be switched between an enable state and a disable state depending on the control signal $S_H$, becomes an enable state when the control signal $S_H$ is at an OFF level, and sinks (sucks) a current $I_{OFF}$ from the gate of the high-side transistor MH via the gate line 202.

A configuration of the first current source 212 will be described. The first current source 212 mainly includes a first reference impedance element ZR1, a first reference transistor MR1, a first drive transistor MD1, and a first error amplifier EA1. One end of the first reference impedance element ZR1 is connected to the power supply line 206. The first reference transistor MR1 is installed between the other end of the first reference impedance element ZR1 and the gate line 202. A power supply voltage $V_H$ higher than a drain voltage $V_{DD}$ of the high-side transistor MH is supplied to the power supply line 206. The power supply voltage $V_H$ may be generated by the gate driver circuit 200 using a booster circuit such as a charge pump, may be generated by a bootstrap circuit, or may be a voltage supplied from the outside.

The first error amplifier EA1 has an output connected to a gate of the first reference transistor MR1, one input connected to the other end of the first reference impedance element ZR1 (the source of the first reference transistor MR1), and the other input to which a first reference voltage $V_{REF1}$ is input.

The first drive transistor MD1 is of the same type as the first reference transistor MR1, and is installed between the power supply line 206 and the gate line 202.

The first reference transistor MR1 and the first drive transistor MD1 are arranged close to each other on the semiconductor substrate so as to have a pair property.

A size $S_{D1}$ of the first drive transistor MD1 is designed to be sufficiently larger than a size $S_{R1}$ of the first reference transistor MR1. A size S of the transistor is defined as a ratio of a channel width W and a gate length L as follows:

$$S = W/L$$

At least one of the first drive transistor MD1 and the first reference transistor MR1 is configured to be variable in size (S=W/L).

For example, when the size ratio of the first drive transistor MD1 and the first reference transistor MR1 is defined as $(S_{D1}/S_{R1})$, $(S_{D1}/S_{R1})$ may be designed to be variable within a range of 100 to 100,000 times.

One end of a first impedance element Z1 is connected to the power supply line 206. A first reference current source CSR1 is connected to the other end of the first impedance element Z1. When a current $I_R$ generated by the first reference current source CSR1 flows through the first impedance element Z1, the first reference voltage $V_{REF1}$ is generated at the other end thereof. The first impedance element Z1 and the first reference impedance element ZR1 use the elements of the same type, and are arranged close to each other on the semiconductor substrate so as to have a pair property.

The configuration of the first current source 212 has been described above. The second current source 214 mainly includes a second reference transistor MR2, a second reference impedance element ZR2, and a second drive transistor MD2. The second current source 214 may be regarded as a configuration in which the first current source 212 is turned upside down and the conductivity type of the transistor is changed. Also for the second current source 214, at least one of the second drive transistor MD2 and the second reference transistor MR2 is configured to be variable in size (S=W/L).

In addition, a second reference current source CSR2 and a second impedance element Z2 are installed in order to generate a second reference voltage $V_{REF2}$.

Before the start of operation, a set value SETH for designating a size ratio between the first reference transistor MR1 and the first drive transistor MD1 is provided to the gate driver circuit 200. In addition, a set value SETL for designating a size ratio between the second reference transistor MR2 and the second drive transistor MD2 is provided to the gate driver circuit 200. The set values SETH and SETL can be externally set by an inter-IC (I²C) interface or a serial peripheral interface (SPI).

The controller 240 sets a size ratio $S_{D1}/S_{R1}$ of the first current source 212 side based on the set value SETH, and sets a size ratio $S_{D2}/S_{R2}$ of the second current source 214 side based on the set value SETL.

The first current source 212 can be switched between the enable state and the disable state depending on the control signal $S_H$. When the control signal $S_H$ is high (ON level), the first current source 212 is enabled and an output of the first error amplifier EA1 is connected to the gates of the first reference transistor MR1 and the first drive transistor MD1.

When the control signal $S_H$ is low (OFF level), the first current source 212 is disabled and the output of the first error amplifier EA1 is disconnected from the gates of the first reference transistor MR1 and the first drive transistor MD1. In the disable state, the gates are pulled up so that the first reference transistor MR1 and the first drive transistor MD1 are reliably turned off.

The same applies to the second current source 214, in which the second current source 214 can be switched between the enable state and the disable state depending on an inverted signal of the control signal $S_H$. When the control signal $S_H$ is low, the second current source 214 is enabled and an output of the second error amplifier EA2 is connected to gates of the second reference transistor MR2 and the second drive transistor MD2.

When the control signal $S_H$ is high, the second current source 214 is disabled and the output of the second error amplifier EA2 is disconnected from the gates of the second reference transistor MR2 and the second drive transistor MD2. In the disable state, the gates are pulled down so that the second reference transistor MR2 and the second drive transistor MD2 are reliably turned off.

Since the low-side driver 220 may be configured similarly to the high-side driver 210, a description thereof will be omitted. The configuration of the gate driver circuit 200 has been described above. Next, an operation thereof will be described.

Figure 3A:
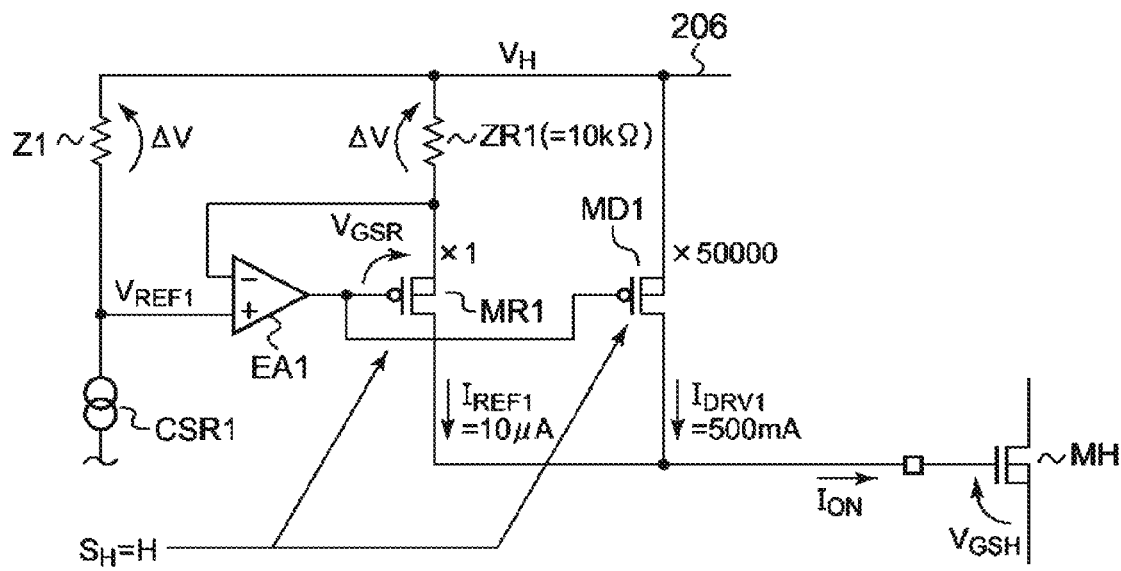
FIG. 3A and FIG. 3B are diagrams illustrating an operation state of a gate driver circuit in FIG. 2.
Figure 3B:
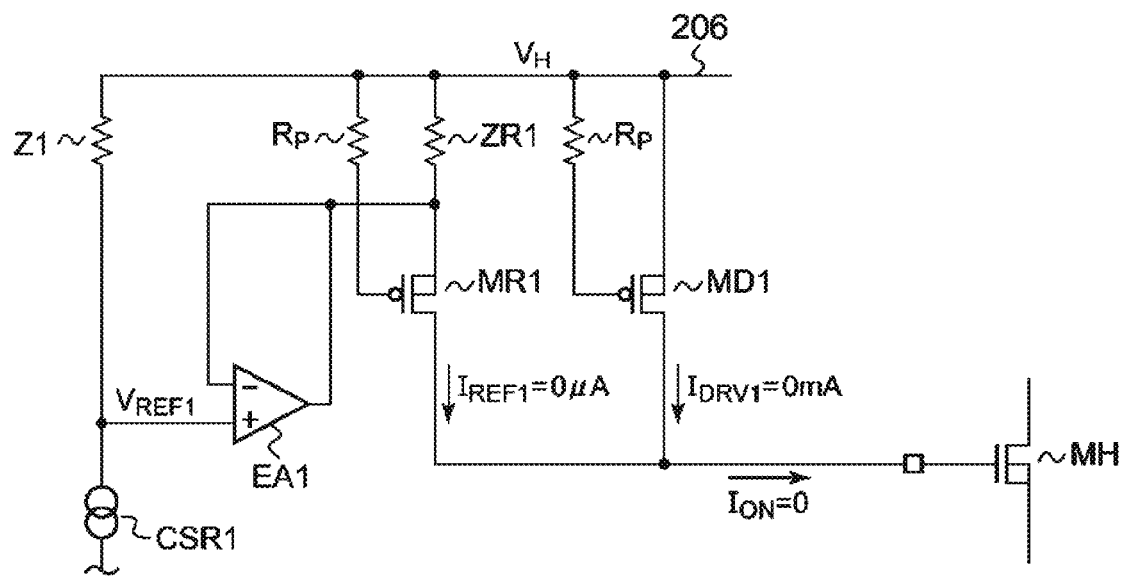

FIG. 3A and FIG. 3B are diagrams illustrating an operation state of the gate driver circuit 200 in FIG. 2. In FIG. 3A and FIG. 3B, only the first current source 212 is illustrated. In this example, the size of the first drive transistor MD1 is set to 50,000 times the size of the first reference transistor MR1. Further, the specific numerical values referred to herein are merely for the purpose of simplifying the description and facilitating understanding.

FIG. 3A illustrates a first state in which the control signal $S_H$ is at an ON level (H). A voltage drop $\Delta V$ occurs in the first impedance element Z1 by a reference current $I_{R1}$ generated by the first reference current source CSR1, such that $V_{REF1}=V_H-\Delta V$. Feedback is applied so that the voltage drop of the first reference impedance element ZR1 becomes $\Delta V$ by the first error amplifier EA1. Assuming that a resistance value of ZR1 is 10 kΩ and $\Delta V=0.1$ V, a current of $I_{REF1}=10$ μA flows through the first reference transistor MR1. When a gate-source voltage of the first reference transistor MR1 at this time is $V_{GSR}$, $\Delta V+V_{GSR}$ is applied between the gate and the source of the first drive transistor MD1 and a current $I_{DRV1}$ of $I_{DRV1} \approx I_{REF1} \times 50,000 = 500$ mA flows through the first drive transistor MD1.

Then, the sum of the currents of the first reference transistor MR1 and the first drive transistor MD1 becomes a drive current $I_{ON}$. Furthermore, it can be said that a reference current $I_{REF1}$ is sufficiently smaller than the drive current $I_{DRV1}$, which may be ignored, and an effective drive current $I_{ON}$ is generated by the first drive transistor MD1.

FIG. 3B illustrates a second state in which the control signal $S_H$ is at an OFF level (L). In the second state, the gates of the first reference transistor MR1 and the first drive transistor MD1 are disconnected from the gate of the first error amplifier EA1 and are pulled up to the power supply line 206 via a pull-up resistor. At this time, $I_{REF1}$ and $I_{DRV1}$ are zero, and the drive current $I_{ON}$ also becomes zero.

In the second state, the output of the first error amplifier EA1 may be connected to its inverting input terminal to operate as a buffer. Thus, an output voltage of the first error amplifier EA1 and a potential of a connection node between the first reference impedance element ZR1 and the first reference transistor MR1 can be kept at the same voltage level as in the first state even when the control signal $S_H$ is at an OFF level. Accordingly, when the control signal $S_H$ transitions to an ON level next time, the drive current $I_{ON}$ can be raised in a short time.

Figure 4:
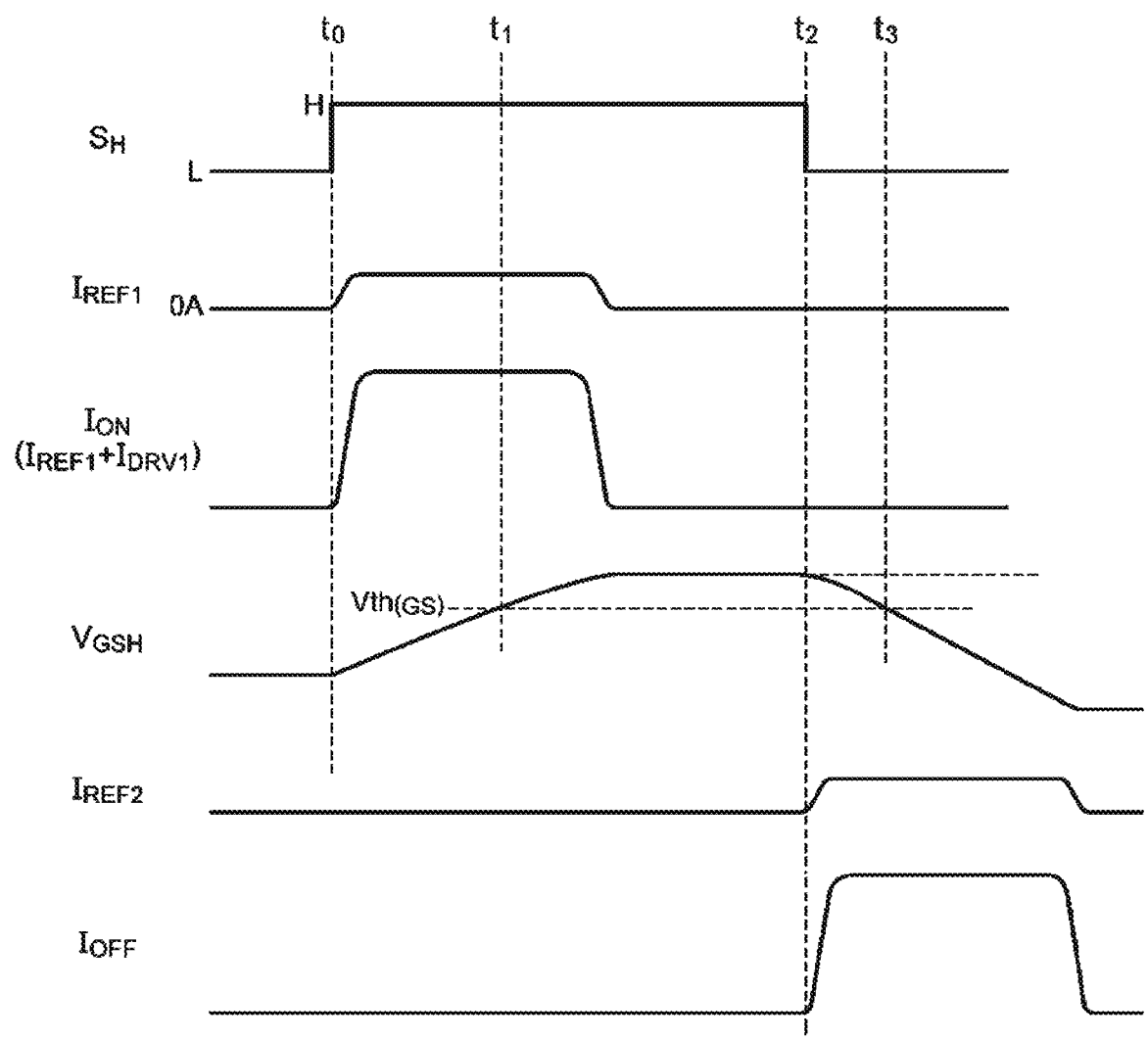
FIG. 4 is an operation waveform diagram of the switching circuit in FIG. 2.

FIG. 4 is an operation waveform diagram of the switching circuit 100 in FIG. 2. When the control signal $S_H$ becomes an ON level at time $t_0$, the reference current $I_{REF1}$ flows through the first reference transistor MR1 and the drive current $I_{ON}$ substantially proportional to the reference current $I_{REF1}$ is generated. A proportional constant depends on the size ratio $S_{D1}/S_{R1}$. When the gate capacitance of the high-side transistor MH is charged by the drive current $I_{ON}$, the gate-source voltage $V_{GSH}$ of the high-side transistor MH increases. Then, when the gate voltage of the high-side transistor MH rises and the gate-source voltage $V_{GS}H$ exceeds a threshold value $V_{th(GS)}$ of the MOS transistor at time $t_1$, the high-side transistor MH is turned on. Thereafter, when the gate voltage of the high-side transistor MH approaches the power supply voltage $V_H$, a drain-source voltage of the first reference transistor MR1 and the first drive transistor MD1 approaches zero and the drive current $I_{ON}$ becomes zero. Thereafter, the high-side transistor MH is kept turned on.

When the control signal $S_H H$ becomes an OFF level at time $t_2$, the first current source 212 is disabled, the second current source 214 is enabled, a reference current $I_{REF2}$ flows through the second reference transistor MR2, and a drive current $I_{OFF}$ substantially proportional to the reference current $I_{REF2}$ is generated. The proportional constant depends on the size ratio $S_{D2}/S_{R2}$. When a gate capacitance of the high-side transistor MH is discharged by the drive current $I_{OFF}$, the gate-source voltage $V_{GSH}$ of the high-side transistor MH decreases. Then, when the gate-source voltage $V_{GSH}$ falls below the threshold value $V_{th(GS)}$ of the MOS transistor at time $t_3$, the high-side transistor MH is turned off. Thereafter, when the gate voltage of the high-side transistor MH decreases, a drain-source voltage of the second reference transistor MR2 and the second drive transistor MD2 approaches zero and the drive current $I_{OFF}$ becomes zero. Thereafter, the high-side transistor MH is kept turned off.

The operation of the gate driver circuit 200 has been described above.

According to the gate driver circuit 200, the drive current $I_{ON}$ can be adjusted according to the size ratio $S_{D1}/S_{R1}$ and a slew rate of the gate voltage at the time of turning on the high-side transistor MH can be set. Similarly, the drive current $I_{OFF}$ can be adjusted according to the size ratio $S_{D2}/S_{R2}$ and a slew rate of the gate voltage at the time of turning off the high-side transistor MH can be set.

The same applies to driving the low-side transistor ML.

Figure 5:
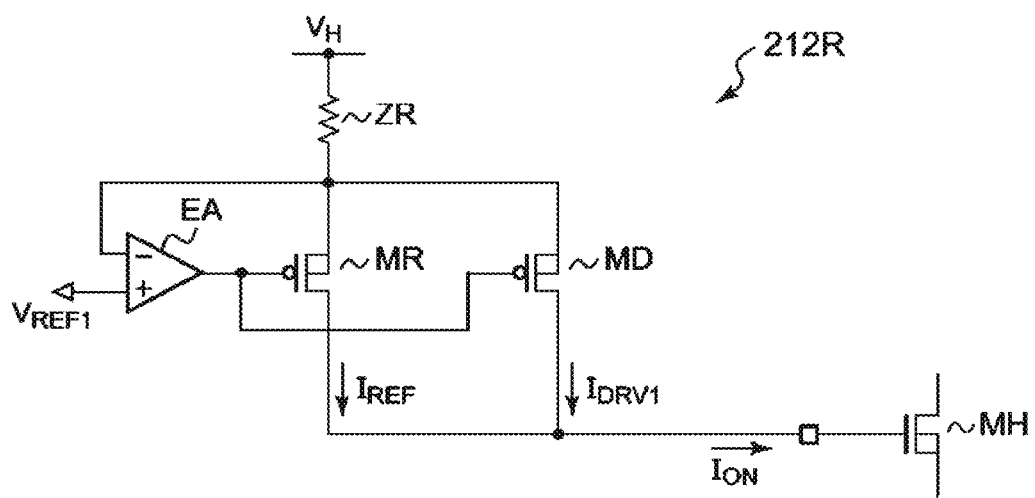
FIG. 5 is a circuit diagram of part of a gate driver circuit according to a comparative technique.

The advantages of the gate driver circuit 200 are further specified by comparison with a comparative technique. FIG. 5 is a circuit diagram of part of a gate driver circuit 200R according to the comparative technique. In FIG. 5, only a portion (212R) corresponding to the first current source 212 is illustrated. In this comparative technique, sources of a reference transistor and a drive transistor are commonly connected, and an entire drive current $I_{ON}$ flows through a reference impedance element ZR. Therefore, very large power loss occurs in the reference impedance element ZR. For example, assuming that a voltage drop of the reference impedance element ZR is $\Delta V=0.1$ V and $I_{ON}=500$ mA, power of $\Delta V \times I_{ON}=50$ mW is consumed in the reference impedance element ZR.

On the other hand, according to the gate driver circuit 200 in FIG. 2, since only a very small portion $I_{REF1}$ of the drive current $I_{ON}$ flows through the first reference impedance element ZR1, the power loss can be greatly reduced. If $\Delta V=0.1$ V and $I_{REF1}=10$ μA, the power consumption is merely $\Delta V \times I_{ON}=1$ μW.

The present disclosure is recognized by the block diagram and the circuit diagram of FIG. 2, and encompasses various devices and circuits derived from the foregoing description and is not limited to a specific configuration. Hereinafter, a more specific configuration example and modifications will be described in order to facilitate and clarify understanding of the essence and circuitry operation of the present disclosure, rather than to narrow the scope of the disclosure.

First Embodiment

Figure 6:
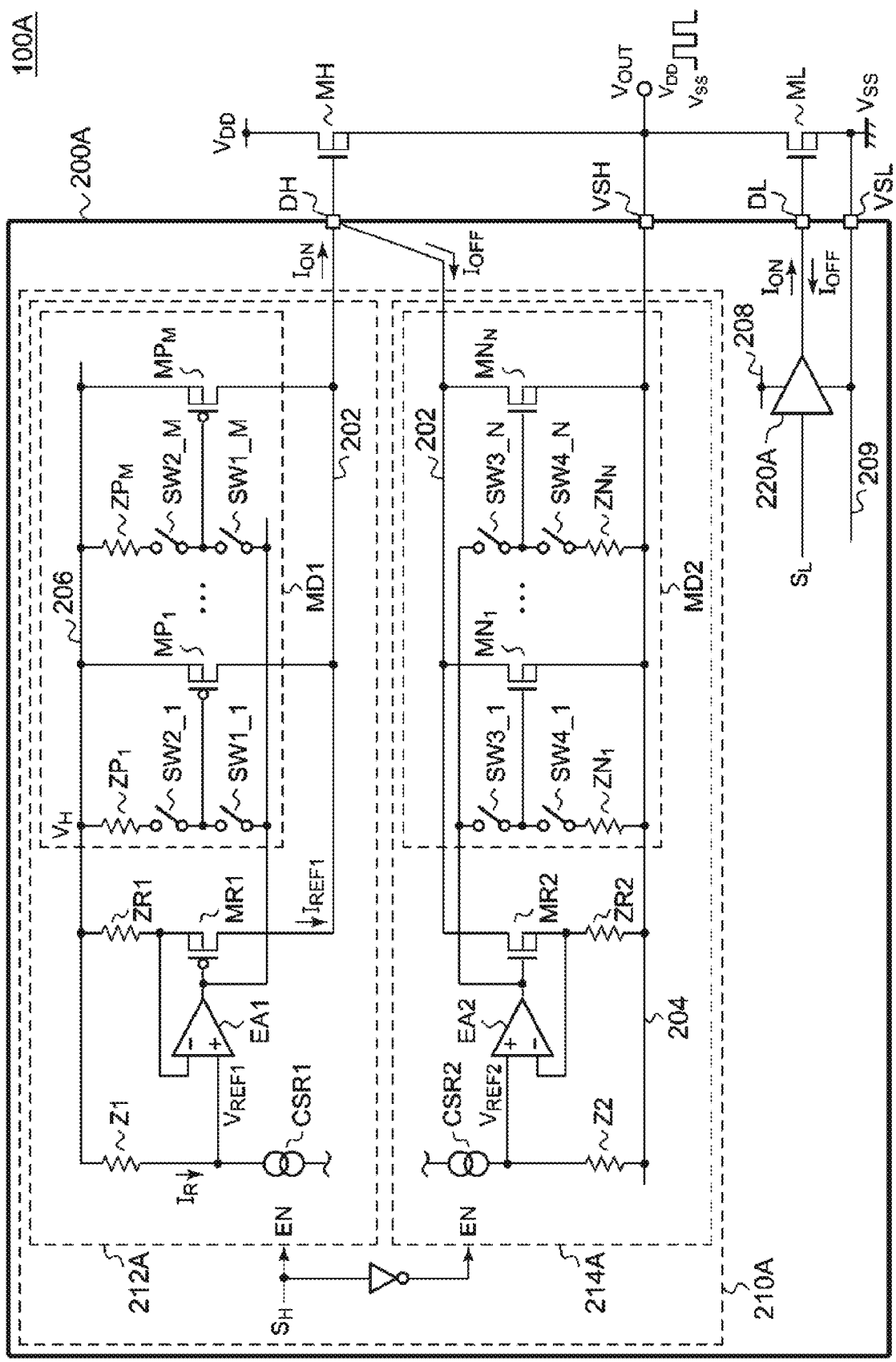
FIG. 6 is a circuit diagram of a gate driver circuit according to a first example.

FIG. 6 is a circuit diagram of a gate driver circuit 200A according to a first embodiment. In the first embodiment, a first current source 212A is configured so that a size $S_{R1}$ of a first reference transistor MR1 is fixed and a size $S_{D1}$ of a first drive transistor MD1 is variable. Similarly, a second current source 214A is configured so that a size $S_{R2}$ of a second reference transistor MR2 is fixed and a size $S_{D2}$ of a second drive transistor MD2 is variable.

The first drive transistor MD1 includes a plurality of transistor elements $MP_1$ to $MP_M$ connected in parallel. The number M of transistor elements MP is not particularly limited and may be any number of 2 or more. The plurality of transistor elements MP are arranged close to one another on a semiconductor substrate so as to have a pair property with the first reference transistor MR1.

The plurality of transistor elements $MP_1$ to $MP_M$ may be individually and selectively enabled or disabled. The first drive transistor MD1 is formed by parallel connection of the enabled transistor elements MP.

When the transistor element $MP_i$ is enabled, its gate is connected to the output of the first error amplifier EA1. When the transistor element $MP_i$ is disabled, a voltage unrelated to the output of the first error amplifier EA1 is applied to its gate to turn off the transistor element $MP_i$. That is, the first current source 212A is configured so that a state, in which the gate of each of the plurality of transistor elements $MP_1$ to $MP_M$ is connected to the output of the first error amplifier EA1, and an OFF state can be switched.

The sizes of the plurality of transistor elements $MP_1$ to $MP_M$ may be the same or different. When the size of an i-th ($1 \leq i \leq M$) transistor element $MP_i$ is written as $S_i$, $S_i \gg S_{R1}$ is established and $S_1, S_2, \ldots S_M$ may be equal to or larger than 100 times $S_{R1}$. The size $S_{D1}$ of the first drive transistor MD1 is the sum of the sizes of the enabled transistor elements MP and is given by the following equation. Here, j indicates a number of an enabled transistor element.

$$S_{D1} = \Sigma S_j$$

The drive current $I_{ON}$ is given by the following equation.

$$I_{ON} = I_{REF1} \times \Sigma S_j / S_{R1}$$

The circuit configuration for controlling the enabling/disabling of each transistor element MP is not particularly limited. For example, the first drive transistor MD1 may include, in addition to the plurality of transistor elements $MP_1$ to $MP_M$, a plurality of first switches SW1_1 to SW1_M, a plurality of second switches SW2_1 to SW2_M, and a plurality of impedance elements $ZP_1$ to $ZP_M$, corresponding to the plurality of transistor elements $MP_1$ to $MP_M$.

The enabling/disabling of each transistor element $MP_i$ is controlled according to the corresponding first switch SW1_i, second switch SW2_i, and impedance element $ZP_i$. The first switch SW1_i is installed between a gate of a corresponding transistor element $MP_i$ and the output of the first error amplifier EA1. The second switch SW2_i is installed between the gate and a source of the corresponding transistor element $MP_i$. The impedance element $ZP_i$ may be installed in series with the second switch SW2_i between the gate and the source of the corresponding transistor element $MP_i$.

The controller 240 turns on the first switch SW1_i and turns off the second switch SW2_i for the transistor element $MP_i$ to be enabled. In addition, the controller 240 turns off the first switch SW1_i and turns on the second switch SW2_i for the transistor element $MP_i$ to be disabled. Either the impedance element MP or the second switch SW2 may be omitted.

The second current source 214A may also be configured in a similar manner to the first current source 212A. Specifically, the second drive transistor MD2 includes a plurality of transistor elements $MN_1$ to $MN_M$ connected in parallel. The number N of transistor elements MN is not particularly limited and may be any number of 2 or more. The plurality of transistor elements MN are arranged close to one another on the semiconductor substrate so as to have a pair property with the second reference transistor MR2.

The plurality of transistor elements $MN_1$ to $MN_M$ may be individually and selectively enabled or disabled, and the second drive transistor MD2 is formed by parallel connection of the enabled transistor elements MN.

A third switch SW3, a fourth switch SW4, and an impedance element ZN are installed to switch the enabling/disabling of the transistor element MN. The controller 240 turns on a third switch SW3_i and turns off a fourth switch SW4_i for the transistor element $MN_i$ to be enabled. In addition, the controller 240 turns off the third switch SW3_i and turns on the fourth switch SW4_i for the transistor element MN_i to be disabled. Either the impedance element MN or the fourth switch SW4 may be omitted.

In addition, the plurality of transistor elements $MN_1$ to $MN_N$ are all turned on during an ON period of a low-side transistor ML of a bridge circuit 102 and can strongly turn off a high-side transistor MH during the ON period of the low-side transistor ML. Therefore, even when a transition (voltage fluctuation) at the time of turning on the low-side transistor ML is input to the gate of the high-side transistor MH by capacitive coupling, it is possible to prevent the high-side transistor MH from being erroneously turned on.

Second Example

Figure 7:
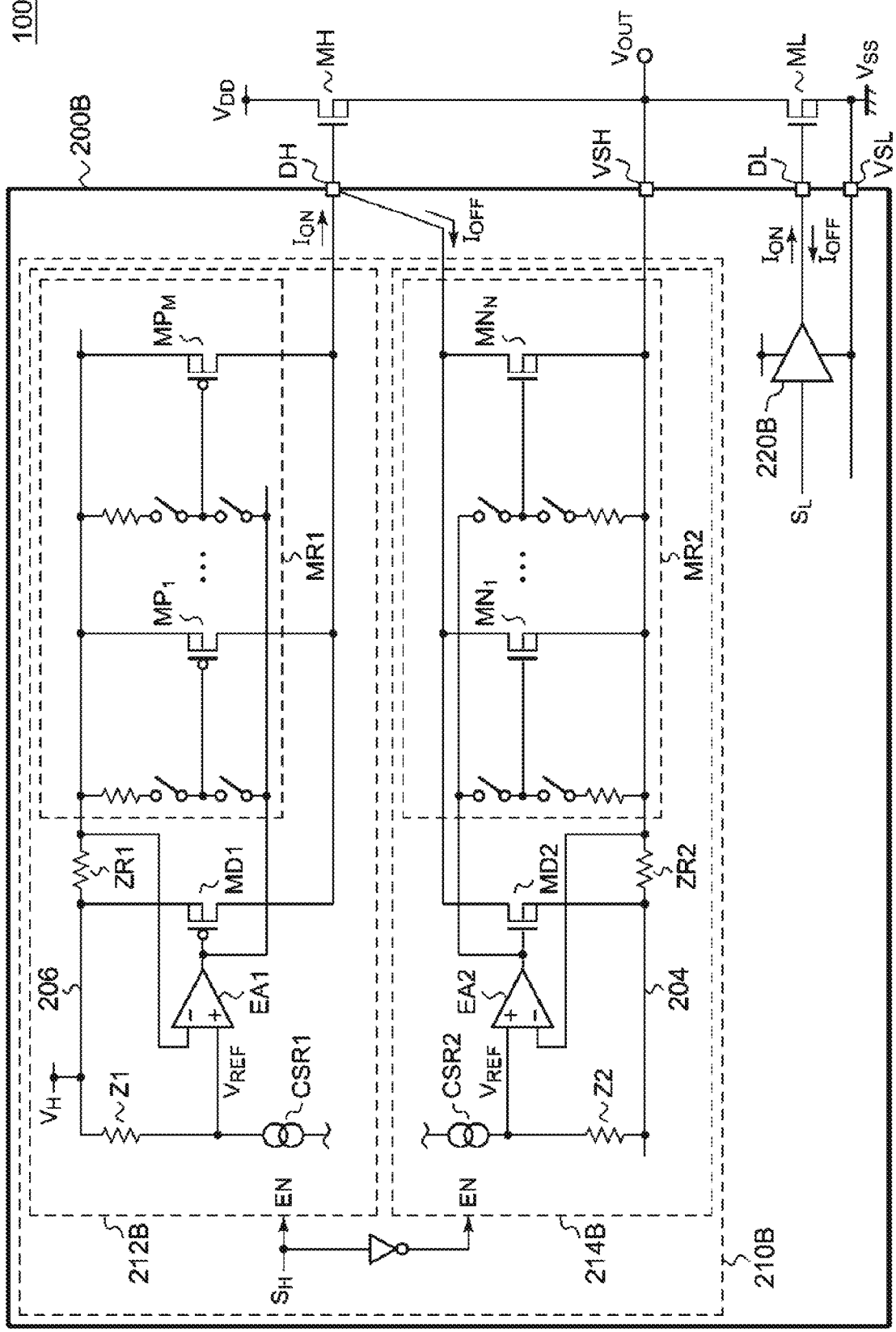
FIG. 7 is a circuit diagram of a gate driver circuit according to a second example.

FIG. 7 is a circuit diagram of a gate driver circuit 200B according to a second example. In the second example, a first current source 212B is configured so that a size $S_{R1}$ of a first reference transistor MR1 is variable and a size $S_{D1}$ of a first drive transistor MD1 is fixed. Similarly, a second current source 214B is configured so that a size $S_{R2}$ of a second reference transistor MR2 is variable and a size $S_{D2}$ of a second drive transistor MD2 is fixed.

For the first current source 212B, the first reference transistor MR1 includes a plurality of transistor elements $MP_1$ to $MP_M$ connected in parallel. The number M of transistor elements MP is not particularly limited and may be any number of 2 or more. The plurality of transistor elements $MP_1$ to $MP_M$ may be individually and selectively enabled or disabled. The first reference transistor MR1 is formed by parallel connection of the enabled transistor elements MP. The configuration of the first reference transistor MR1 in FIG. 7 is similar to that of the first drive transistor MD1 in FIG. 6.

The sizes of the plurality of transistor elements $MP_1$ to $MP_M$ may be the same or different. When the size of an i-th ($1 \leq i \leq M$) transistor element $MP_i$ is written as $S_i$, $S_i \ll S_{D1}$ is established and $S_1, S_2, \ldots S_M$ may be equal to or less than $1/100$ times $S_{D1}$.

The size $S_{R1}$ of the first reference transistor MR1 is the sum of the sizes of the enabled transistor elements MP and is given by the following equation. Here, j indicates a number of an enabled transistor element.

$$S_{R1} = \Sigma S_j$$

The drive current $I_{ON}$ is given by the following equation.

$$I_{ON} = I_{REF1} \times S_{D1} / \Sigma S_j$$

For the second current source 214B, the second reference transistor MR2 includes a plurality of transistor elements MN$_1$ to MN$_N$ connected in parallel. The second reference transistor MR2 is formed by parallel connection of the enabled transistor elements MN. The configuration of the second reference transistor MR2 in FIG. 7 is similar to that of the second drive transistor MD2 in FIG. 6.

(Applications)

Figure 8:
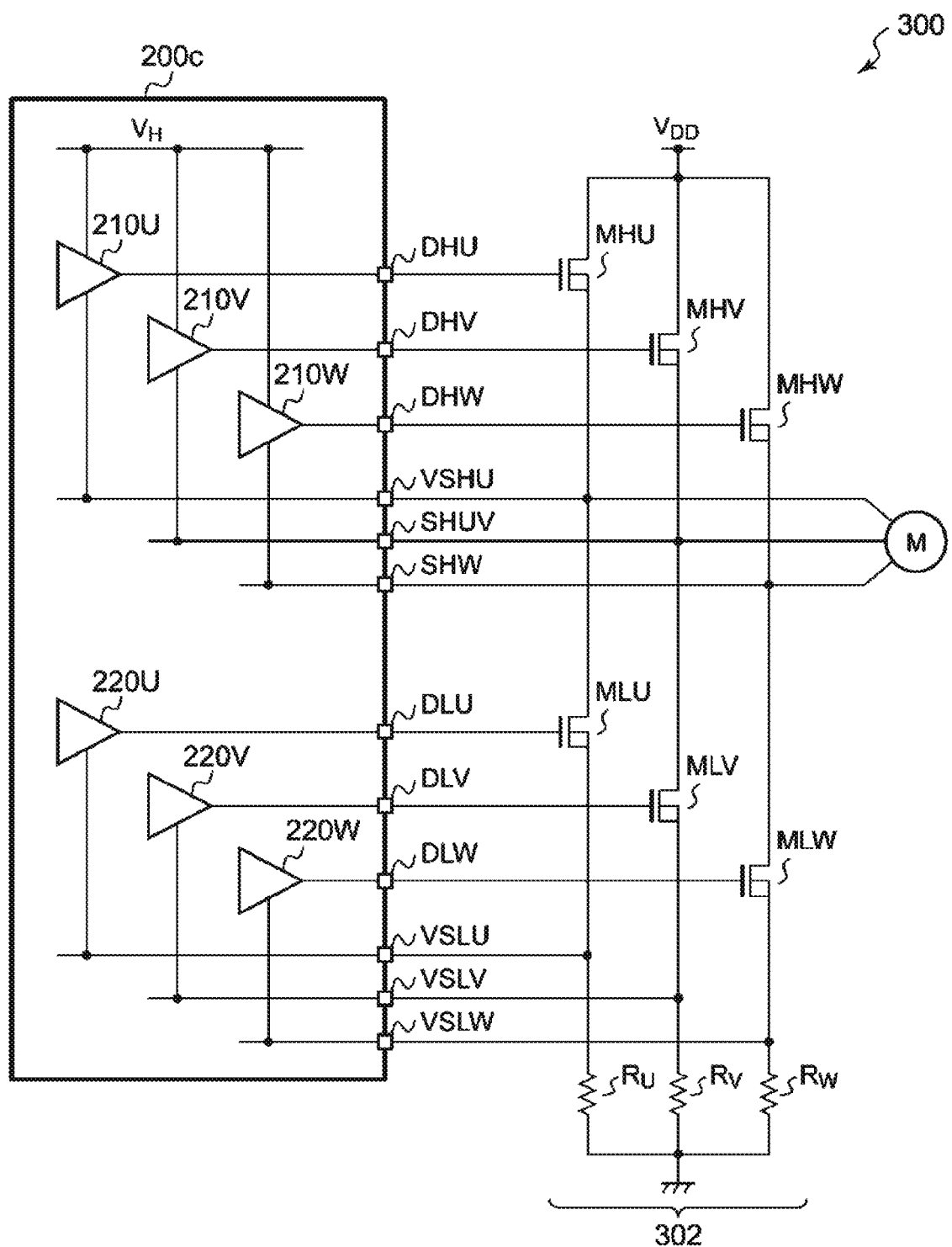
FIG. 8 is a block diagram of a motor driver circuit.

Next, applications of the gate driver circuit 200 will be described. The gate driver circuit 200 may be suitably used for a motor driver. FIG. 8 is a block diagram of a motor driver circuit. In this example, the object to be driven is a three-phase motor, and a motor driver circuit 300 includes a three-phase bridge circuit (three-phase inverter) 302 and a gate driver circuit 200C. The three-phase bridge circuit 302 includes U-, V-, and W-phase legs, each of which includes a high-side transistor MH and a low-side transistor ML.

Shunt resistors R$_U$, R$_V$, and R$_W$ for current detection are installed in the respective legs of the three-phase bridge circuit 302. High-side drivers 210U, 210V, and 210W drive high-side transistors MHU, MHV, and MHW. Low-side drivers 220U, 220V, 220W drive low-side transistors MLU, MLU, and MLW. The high-side driver 210 and the low-side driver 220 are configured using the architecture of the gate driver circuit 200 described above.

The present disclosure has been described above based on the embodiments. It is to be understood by those skilled in the art that the embodiments are merely illustrative and may be differently modified by combinations of the components or processes thereof, and the modifications are also within the scope of the present disclosure. Hereinafter, these modifications will be described.

The application of the gate driver circuit 200 is not limited to the driver circuit of a three-phase motor, but may be applied to a drive circuit of a single-phase motor. Alternatively, the present disclosure may be applied to a drive circuit of a switching element of a switching power supply.

A first current source 212 may be used for applications other than the gate driver circuit. For example, the first current source 212 may be connected to an anode of a light emitting diode (LED) and used as an LED drive circuit.

A second current source 214 may be used for applications other than the gate driver circuit. For example, the second current source 214 may be connected to a cathode of an LED and used as an LED drive circuit.

According to the present disclosure in some embodiments, it is possible to switch a slew rate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gate driver circuit for driving a power transistor, comprising:
    a gate line configured to be connected to a gate of the power transistor;
    a source line configured to be connected to a source of the power transistor;
    a first current source configured to source a current to the gate line; and
    a second current source configured to sink a current from the gate line,
    wherein the first current source includes:
        a first reference impedance element having one end connected to a power supply line;
        a first reference transistor installed between the other end of the first reference impedance element and the gate line;
        a first error amplifier having an output connected to a gate of the first reference transistor, one input connected to the other end of the first reference impedance element, and the other input to which a first reference voltage is input; and
        a plurality of first transistor elements installed in parallel between the power supply line and the gate line,
    wherein the first current source is configured to be switched between a state, in which a gate of each of the plurality of first transistor elements is connected to the output of the first error amplifier, and an OFF state.

2. The circuit of claim 1, wherein the first current source further includes:
    a plurality of first switches, each of the first switches being installed between a gate of a corresponding one of the plurality of first transistor elements and the output of the first error amplifier.

3. The circuit of claim 1, wherein the first current source further includes:
    a plurality of second switches, each of the second switches being installed between a gate and a source of a corresponding one of the plurality of first transistor elements.

4. The circuit of claim 1, wherein the first current source further includes:
    a first impedance element having one end connected to the power supply line; and
    a first reference current source connected to the other end of the first impedance element, wherein a voltage at the other end of the first impedance element is the first reference voltage.

5. The circuit of claim 1, wherein the second current source includes:
    a second reference impedance element having one end connected to the source line;
    a second reference transistor installed between the other end of the second reference impedance element and the gate line;
    a second error amplifier having an output connected to a gate of the second reference transistor, one input connected to the other end of the second reference impedance element, and the other input to which a second reference voltage is input; and
    a plurality of second transistor elements installed in parallel between the gate line and the source line and being of the same type as the second reference transistor,
    wherein the second current source is configured to be switched between a state, in which a gate of each of the plurality of second transistor elements is connected to the output of the second error amplifier, and an OFF state.

6. The circuit of claim 5, wherein the power transistor is a high-side transistor of a bridge circuit, and
    wherein the plurality of second transistor elements are all turned on during an ON period of a low-side transistor of the bridge circuit.

7. A gate driver circuit for driving a power transistor, comprising:
    a gate line configured to be connected to a gate of the power transistor;

a source line configured to be connected to a source of the power transistor;
a first current source configured to source a current to the gate line; and
a second current source configured to sink a current from the gate line,
wherein the first current source includes:
a first reference impedance element having one end connected to a power supply line;
a plurality of first transistor elements installed in parallel between the other end of the first reference impedance element and the gate line;
a first drive transistor installed between the power supply line and the gate line and being of the same type as the first transistor elements; and
a first error amplifier having an output connected to the gate of the first drive transistor, one input connected to the other end of the first reference impedance element, and the other input to which a first reference voltage is input,
wherein the first current source is configured to be switched between a state, in which a gate of at least one of the plurality of first transistor elements is connected to the output of the first error amplifier, and an OFF state.

8. The circuit of claim 7, wherein the second current source includes:
a second reference impedance element having one end connected to the source line;
a plurality of second transistor elements installed in parallel between the other end of the second reference impedance element and the gate line;
a second drive transistor installed between the power supply line and the gate line and being of the same type as the second transistor elements; and
a second error amplifier having an output connected to a gate of the second drive transistor, one input connected to the other end of the second reference impedance element, and the other input to which a second reference voltage is input,
wherein the second current source is configured to be switched between a state, in which a gate of at least one of the plurality of second transistor elements is connected to the output of the second error amplifier, and an OFF state.

9. A gate driver circuit for driving a power transistor, comprising:

a gate line configured to be connected to a gate of the power transistor;
a source line configured to be connected to a source of the power transistor;
a first current source configured to source a current to the gate line; and
a second current source configured to sink a current from the gate line,
wherein the first current source includes:
a first reference impedance element having one end connected to a power supply line;
a first reference transistor installed between the other end of the first reference impedance element and the gate line;
a first drive transistor installed between the power supply line and the gate line and being of the same type as the first reference transistor; and
a first error amplifier having an output connected to a gate of each of the first reference transistor and the first drive transistor, one input connected to the other end of the first reference impedance element, and the other input to which a first reference voltage is input,
wherein a size of at least one of the first reference transistor and the first drive transistor is variable.

10. The circuit of claim 9, wherein the second current source includes:
a second reference impedance element having one end connected to the source line;
a second reference transistor installed between the other end of the second reference impedance element and the gate line;
a second drive transistor installed between the source line and the gate line and being of the same type as the second reference transistor; and
a second error amplifier having an output connected to a gate of each of the second reference transistor and the second drive transistor, one input connected to the other end of the second reference impedance element, and the other input to which a second reference voltage is input,
wherein a size of at least one of the second reference transistor and the second drive transistor is variable.

11. A motor driver circuit, comprising:
a three-phase bridge circuit; and
the gate driver circuit of claim 1 that is configured to drive the three-phase bridge circuit.

* * * * *